(12) United States Patent
Nishimura

(10) Patent No.: US 9,082,328 B2
(45) Date of Patent: Jul. 14, 2015

(54) MULTI-FUNCTIONAL INTEGRATED CIRCUIT AND SOURCE DRIVER HAVING THE SAME

(71) Applicant: MagnaChip Semiconductor, Ltd., Cheongju-si (KR)

(72) Inventor: Masato Nishimura, Tokyo (JP)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/299,734

(22) Filed: Jun. 9, 2014

(65) Prior Publication Data

US 2014/0285481 A1   Sep. 25, 2014

Related U.S. Application Data

(62) Division of application No. 12/578,055, filed on Oct. 13, 2009, now Pat. No. 8,780,031.

(30) Foreign Application Priority Data

Oct. 28, 2008   (KR) .................. 10-2008-0105817

(51) Int. Cl.
*G09G 5/00* (2006.01)
*G09G 3/20* (2006.01)
*H03K 19/094* (2006.01)
*G09G 3/00* (2006.01)

(52) U.S. Cl.
CPC .. *G09G 5/00* (2013.01); *G09G 3/20* (2013.01); *H03K 19/094* (2013.01); *G09G 3/006* (2013.01); *G09G 2310/027* (2013.01); *G09G 2310/0289* (2013.01); *G09G 2310/08* (2013.01); *G09G 2330/04* (2013.01)

(58) Field of Classification Search
CPC ................ G09G 2310/0264; G09G 2310/027; G09G 2310/0272; G09G 2310/0289
USPC ..................... 345/89–100, 204–215, 690–699
See application file for complete search history.

(56) References Cited

U.S. PATENT DOCUMENTS 5,574,475 A   11/1996   Callahan, Jr. et al.
5,615,164 A    3/1997   Kirihata et al.
(Continued)

FOREIGN PATENT DOCUMENTS

JP   9-505904 A     6/1997
JP   2006-211549 A  8/2006
(Continued)

OTHER PUBLICATIONS

Korean Office Action mailed Oct. 30, 2009 in Korean Application No. 10-2008-0105817 (1 page, in Korean).
(Continued)

*Primary Examiner* — Michael Pervan
(74) *Attorney, Agent, or Firm* — NSIP Law

(57) ABSTRACT

Disclosed are a multi-functional integrated circuit and a source driver having the same. The integrated circuit (IC) chip includes: a first high-voltage transistor configured to pre-charge a storage node in response to a first control signal; a decoding unit configured to decode a plurality of input signals to output the decoded signal to the storage node; and a second high-voltage transistor configured to transfer an output of the decoding unit to the storage node in response to a second control signal.

21 Claims, 10 Drawing Sheets

(56) References Cited

U.S. PATENT DOCUMENTS

| | | | |
|---|---|---|---|
| 5,703,617 | A | 12/1997 | Callahan, Jr. et al. |
| 5,719,591 | A | 2/1998 | Callahan, Jr. et al. |
| 5,726,676 | A | 3/1998 | Callahan, Jr. et al. |
| 5,892,495 | A | 4/1999 | Sakai et al. |
| 6,064,364 | A | 5/2000 | Katoh et al. |
| 2002/0163324 | A1 | 11/2002 | Lee |
| 2006/0214686 | A1 | 9/2006 | Nakao |
| 2007/0200816 | A1 | 8/2007 | Taguchi |
| 2008/0036712 | A1 | 2/2008 | Chung |

FOREIGN PATENT DOCUMENTS

| | | |
|---|---|---|
| KR | 10-2001-0076851 A | 8/2001 |
| KR | 10-2005-0106983 A | 11/2005 |
| WO | WO 95/11506 A1 | 4/1995 |
| WO | WO 98/28731 A2 | 7/1998 |

OTHER PUBLICATIONS

European Search Report mailed Jun. 25, 2010 in European Application No. 09 25 2335.6 (10 pages, in English).

Japanese Office Action mailed Nov. 5, 2013 in Japanese Application No. 2009-238102 (2 pages, in Japanese).

MULTI-FUNCTIONAL INTEGRATED CIRCUIT AND SOURCE DRIVER HAVING THE SAME

CROSS-REFERENCE TO RELATED APPLICATIONS

The present application is a divisional application of U.S. application Ser. No. 12/578,055, filed on Oct. 13, 2009, which claims the benefit of Korean Patent Application No. 10-2008-0105817, filed on Oct. 28, 2008, in the Korean Intellectual Property Office, the disclosures of which are incorporated herein by reference for all purposes.

BACKGROUND OF THE INVENTION

1. Field of the Invention

The present invention relates to a semiconductor design technology, and more particularly, to a compact designed integrated circuit (IC) chip by incorporating latching, level-shifting and decoding functions. The present invention can be used in a source driving device which is a display driving chip, thereby reducing a size of the driving chip.

2. Description of Related Art

In general, a display device includes a source driving device, a gate driver and a pixel array. When digital image data is stored in the pixel array of the display device, the gate driver sequentially drives a plurality of gate lines, and the source driving device stores and displays the digital image data in pixels of the pixel array coupled to the driven gate line.

FIG. 1 is a block diagram illustrating a conventional source driving device.

Referring to FIG. 1, the conventional source driving device includes a shift register 20, a sampling latch 30, a hold latch 40, a level shifter 50, a pre-decoder 60, a decoder 70, and an output buffer 80.

The shift register 20 shifts a start pulse SP input from outside, e.g., a controller, in response to a clock signal CLK. The sampling latch 30 samples digital image data R/G/B input from the controller in response to a plurality of shift signals S1 to SN output from the shift register 20. The hold latch 40 stores the sampled digital image data R/G/B during a horizontal scan time in response to a horizontal sync signal HSYNC.

The level shifter 50 shifts and converts voltage levels of the stored digital image data R/G/B in the hold latch 40 to thereby provide the voltage levels to the pre-decoder 60 since the hold latch 40 operates under low voltage condition such as 0.6 V to 3.3 V while the decoder 70 and the output buffer 80 operate under high voltage condition such as 3.8 V to 18 V. The pre-decoder 60 pre-decodes the digital image data R/G/B output from the level shifter 50 to thereby output the pre-decoded digital image data to the decoder 70.

The decoder 70 decodes the pre-decoded digital image data to thereby provide corresponding one of a plurality of gradation voltages V0 to VZ generated from a gradation voltage generator (not shown) to the output buffer 80. Herein, the decoder 70 performs a function of a digital to analog converter (DAC). The output buffer 80 buffers the gradation voltages V0 to VZ output from the decoder 70 to thereby output them to an output pad 90. The gradation voltages V0 to VZ output from the output pad 90 are provided to a pixel array of a display panel.

As described above, the conventional source driving device includes a latch, a level shifter, a pre-decoder, a decoder, and an output buffer at each channel. Herein, since the pre-decoder and the decoder following after the level shifter are composed of plural transistors for a high voltage, the size of the source driving device becomes large. In particular, lots of transistors for a high voltage are used because the pre-decoder is composed of NAND gates. For a reliability test, a test is required to apply a high voltage stress to the pre-decoder and thus a test circuit for this test is also required to use transistors for a high voltage. Furthermore, it takes lots of time to test the pre-decoder.

Hereinafter, referring to FIG. 2, the test for the pre-decoder is explained in detail.

FIG. 2 is a circuit diagram of a conventional pre-decoder with respect to one channel.

Referring to FIG. 2, the pre-decoder includes a pre-decoding unit 210 and an input unit 220. The pre-decoding unit 210 includes sixteen four-input NAND gates, each of which comprising plural transistors for a high voltage. The input unit 220 includes four inverters for inputting a logic high level or a logic low level to each input terminal of the NAND gates, thereby applying a high voltage stress to the pre-decoder. Here, each inverter also comprises a plurality of transistors for a high voltage.

As described above, the conventional source driving device includes the pre-decoder composed of the NAND gates. Each NAND gate uses four PMOS transistors for a high voltage and four NMOS transistors for a high voltage. Furthermore, for a reliability test, a test circuit is required to apply a high voltage stress to each input terminal of the pre-decoder and thus this test circuit is also required to use transistors for a high voltage. It is possible to test the pre-decoder by replacing the high voltage stress with data applied to the pre-decoder of the source driving device without additional test circuits.

In FIG. 2, to apply the high voltage stress to the NAND gates of the pre-decoder with respect to one channel, total sixteen times high voltage stress are input to the input unit 220 with an input value from '0000' to '1111'. Accordingly, it takes lots of time to test the pre-decoder.

As described above, the conventional source driving device forms a considerably large chip size due to lots of transistors for a high voltage, and requires lots of time for the reliability test.

SUMMARY OF THE INVENTION

An embodiment of the present invention is directed to a source driving device having a small chip size.

Another embodiment of the present invention is directed to a source driving device for reducing time for a reliability test.

Another embodiment of the present invention is directed to a compact designed integrated circuit (IC) chip by incorporating data storing, latching, level-shifting and decoding functions.

Another embodiment of the present invention is directed to an IC chip suitable for low power by incorporating voltage limiting function as well as data storing, latching, level-shifting and decoding functions.

In accordance with an aspect of the present invention, there is provided an integrated circuit (IC) chip including a first high-voltage transistor configured to precharge a storage node in response to a first control signal; a decoding unit configured to decode a plurality of input signals to output the decoded signal to the storage node; and a second high-voltage transistor configured to transfer an output of the decoding unit to the storage node in response to a second control signal.

In accordance with another aspect of the present invention, there is provided an integrated circuit (IC) chip including a first high-voltage transistor configured to precharge a predetermined node in response to a first control signal; a decoding unit configured to decode a plurality of input signals to output the decoded signal to the node; a second high-voltage transistor configured to transfer an output of the decoding unit to the node in response to a second control signal; and a latch unit configured to latch a signal at the node.

In accordance with still another aspect of the present invention, there is provided a source driving device including a sampling latch configured to sample and latch image data input from outside; a circuit block configured to pre-decode data output from the sampling latch, and shift and store a voltage level of the pre-decoded data in response to a control signal; and a decoder configured to decode the pre-decoded image data to transfer one of a plurality of gradation voltages, wherein the circuit block includes: a first high-voltage transistor configured to precharge a storage node in response to a first control signal; a pre-decoding unit configured to decode a plurality of input signals to output the decoded signal to the storage node; and a second high-voltage transistor configured to transfer an output of the decoding unit to the storage node in response to a second control signal.

In accordance with yet another aspect of the present invention, there is provided a source driving device includes a sampling latch configured to sample and latch image data input from outside; a circuit block configured to pre-decode data output from the sampling latch, and shift and latch a voltage level of the pre-decoded data in response to a control signal; and a decoder configured to decode the pre-decoded image data to transfer one of a plurality of gradation voltages, wherein the circuit block includes: a first high-voltage transistor configured to precharge a predetermined node in response to a first control signal; a pre-decoding unit configured to decode a plurality of input signals to output the decoded signal to the node; a second high-voltage transistor configured to transfer an output of the decoding unit to the node in response to a second control signal; and a latch unit configured to latch a signal at the node.

In accordance with even another aspect of the present invention, there is provided integrated circuit (IC) chip including a first high-voltage transistor configured to precharge a predetermined node; a latch unit configured to latch a signal at the node; a decoding unit configured to decode a plurality of input signals to output the decoded signal to the node; and a second high-voltage transistor, coupled between the node and an output node of the decoding unit, configured to operate as a voltage limiter.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

DESCRIPTION OF SPECIFIC EMBODIMENTS

Figure 1:
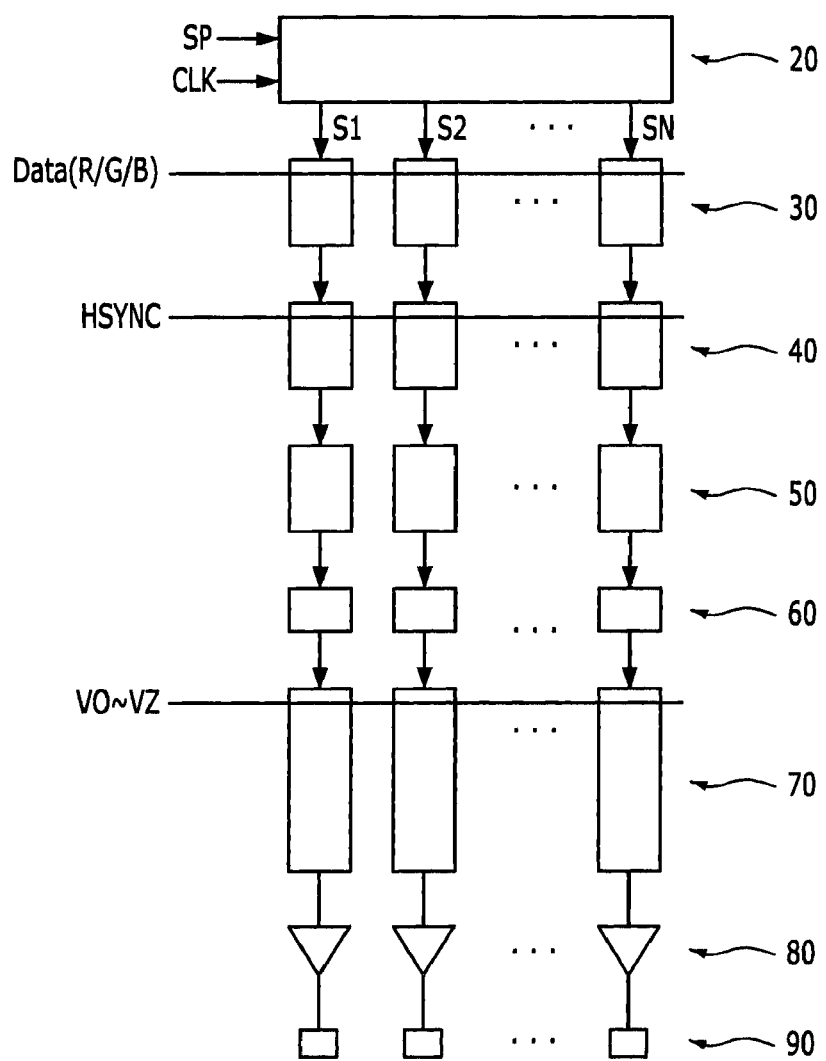
FIG. 1 is a block diagram illustrating a conventional source driving device.
Figure 2:
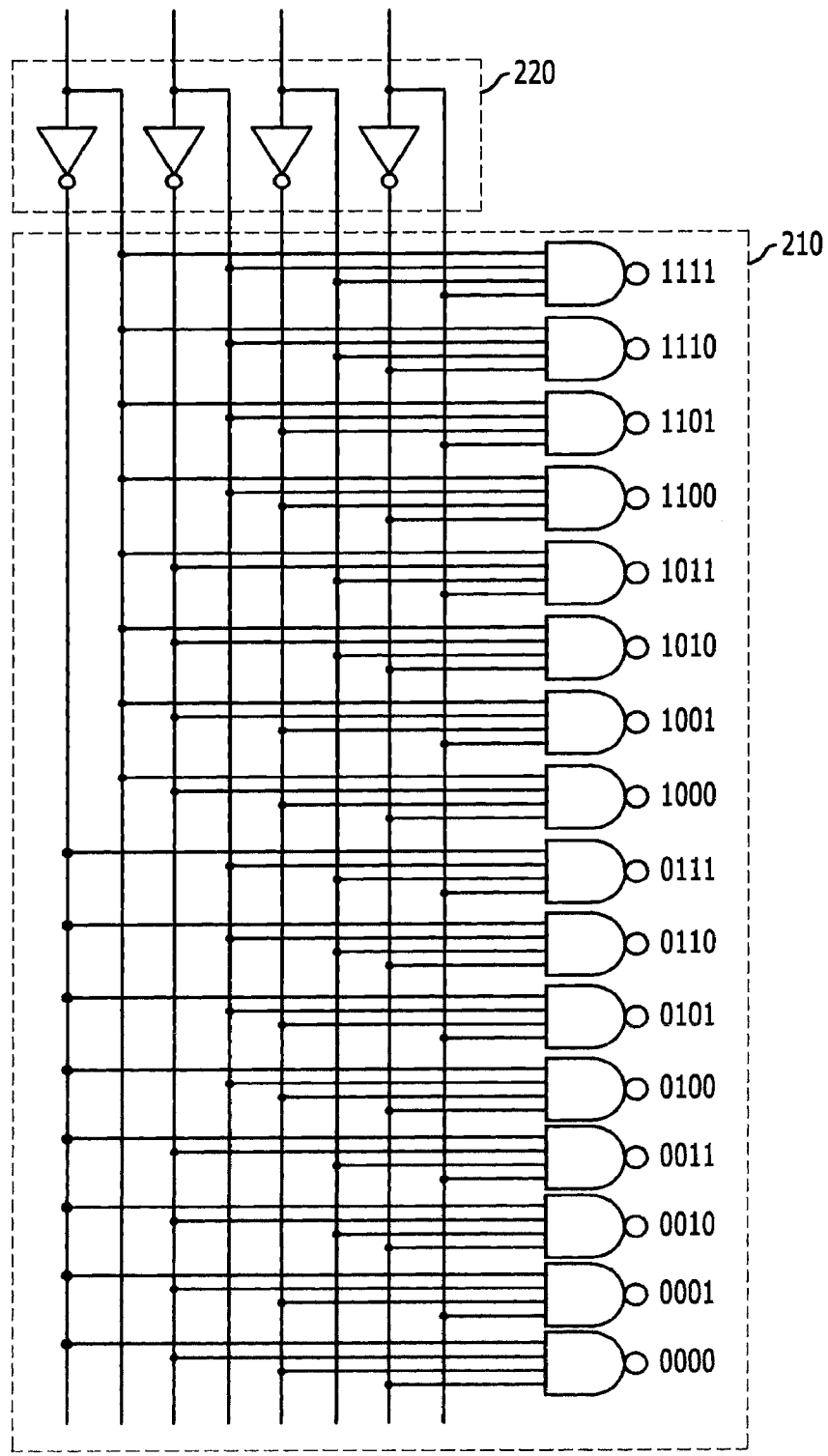
FIG. 2 is a circuit diagram of a conventional pre-decoder with respect to one channel.

Hereafter, preferred embodiments of the present invention will be described in detail with reference to the accompanying drawings in such a manner that the technical idea of the present invention may easily be carried out by a person of ordinary skill in the art to which the invention pertains. In addition, like reference numerals or symbols refer to like elements throughout.

Hereinafter, a transistor for a high voltage is referred to as a high-voltage transistor, and a transistor for a low voltage is referred to as a low-voltage transistor. Further, a PMOS (NMOS) transistor for a high voltage is referred to as a high-voltage PMOS (NMOS) transistor, and a PMOS (NMOS) transistor for a low voltage is referred to as a low-voltage PMOS (NMOS) transistor.

Figure 3:
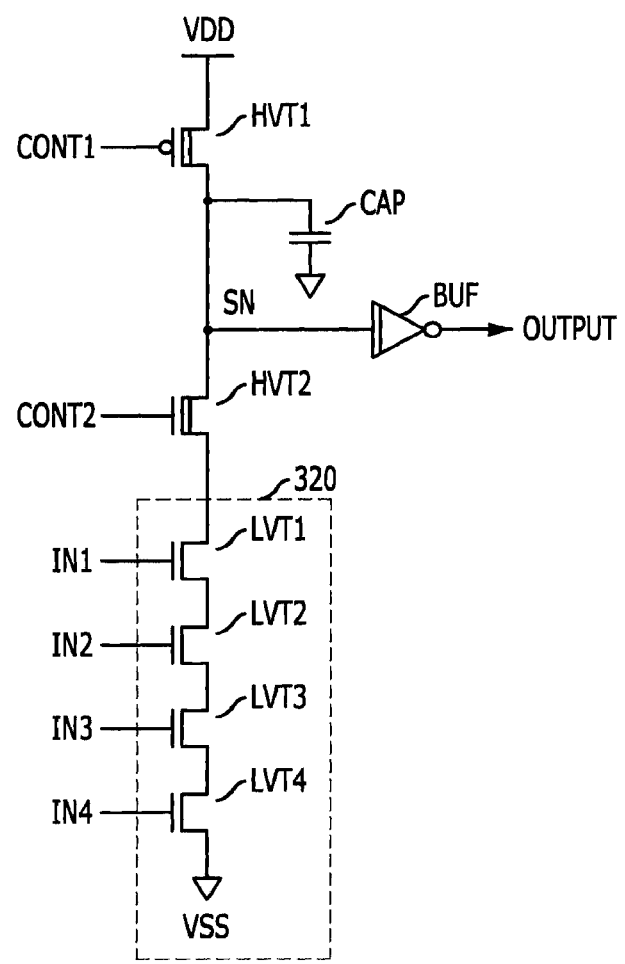
FIG. 3 is a circuit diagram of an integrated circuit (IC) chip in accordance with a first embodiment of the present invention.

FIG. 3 is a circuit diagram of an integrated circuit (IC) chip in accordance with a first embodiment of the present invention.

Referring to FIG. 3, the IC chip in accordance with the first embodiment of the present invention includes a first high-voltage transistor HVT1, a decoding unit 320, and a second high-voltage transistor HVT2.

The first high-voltage transistor HVT1 includes a high-voltage PMOS transistor having a source-drain path connected between a first supply voltage terminal VDD and a storage node SN and a gate receiving a first control signal CONT1 to thereby precharge the storage node SN in response to the first control signal CONT1. The second high-voltage transistor HVT2 includes a high-voltage NMOS transistor having a source-drain path connected between the storage node SN and an output node of the decoding unit 320 and a gate receiving a second control signal CONT2.

In the first embodiment of the present invention, the second control signal CONT2 may be a low-voltage signal to protect low-voltage transistors in the decoding unit 320. Thus, the second high-voltage transistor HVT2 operates as a voltage limiter, and a voltage level higher than that of the second control signal CONT2 does not applied to the low-voltage transistors in the decoding unit 320.

The decoding unit 320 decodes a plurality of input signals IN1 to IN4 to output the decoded signal to the storage node SN. The decoding unit 320 includes a plurality of low-voltage transistors LVT1 to LVT4 connected between the second high-voltage transistor HVT2 and a second supply voltage terminal VSS in series. Each of the low-voltage transistors LVT1 to LVT4 is composed of an NMOS transistor having a gate receiving a corresponding one of the input signals IN1 to IN4.

The IC chip in accordance with the first embodiment of the present invention further includes a capacitor CAP coupled to the storage node SN. The capacitor CAP includes a parasitic capacitor which is formed by layering a first conductive layer, a dielectric layer and a second conductive layer.

The IC chip in accordance with the first embodiment of the present invention further includes a buffer BUF for outputting a signal at the storage node SN to outside. The buffer BUF includes high-voltage transistors.

In the IC chip shown in FIG. 3, after the first high-voltage transistor HVT1 precharges the storage node SN, the second high-voltage transistor HVT2 selectively outputs the decoded signal which is decoded based on the input signals IN1 to IN4 to thereby transfer the decoded signal to the storage node SN. Accordingly, the IC chip has a data storing function by the storage node SN, and the IC chip further includes a decoding/pre-decoding function by the decoding unit 320. Moreover, the IC chip has a level-shifting function because a voltage level of the decoded signal transferred to the storage node SN is shifted by the first and second high-voltage transistors HVT1 and HVT2. The IC chip has a voltage limiting function for protecting the low-voltage transistors.

As described above, the improved IC chip shown in FIG. 3 can be compact designed by incorporating a data storing function, a level-shifting function, a decoding function and a voltage limiting function. Furthermore, the improved IC chip can operate under low power condition because the improved IC chip has only a charge/discharge voltage without a punch-through voltage. In addition, the decoding unit 320 can be implemented with low-voltage NMOS transistors instead of NAND gates.

Figure 4:
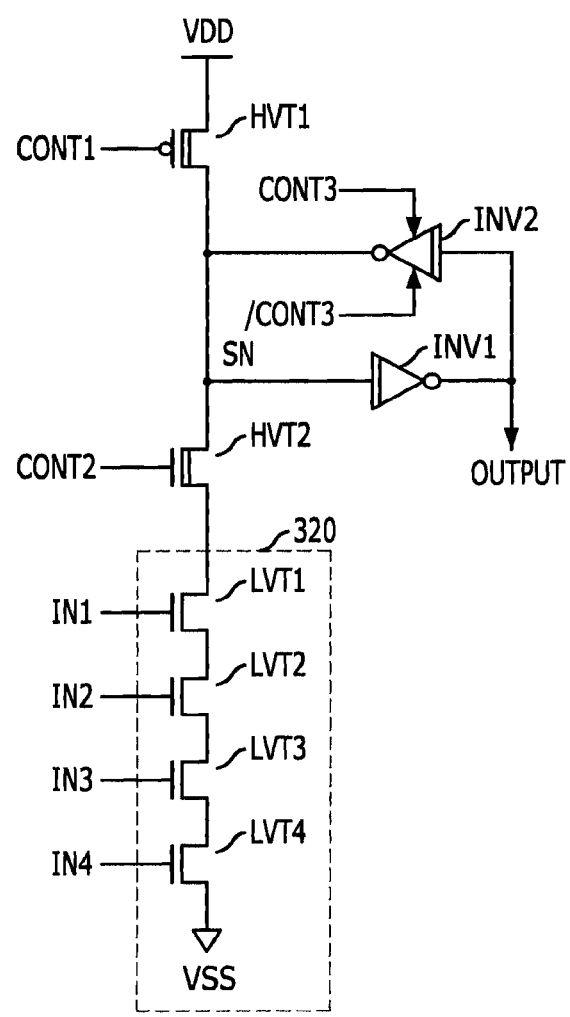
FIG. 4 is a circuit diagram of an IC chip in accordance with a second embodiment of the present invention.

FIG. 4 is a circuit diagram of an IC chip in accordance with a second embodiment of the present invention.

Referring to FIG. 4, the IC chip in accordance with the second embodiment is similar in configuration to the IC chip shown in FIG. 3 except that the capacitor CAP (shown in FIG. 3) is replaced with a latch.

The latch includes a first inverter INV1 and a second inverter INV2. The first inverter INV1 receives and inverts a signal at a storage node SN to output the inverted signal to outside, and the second inverter INV2 receives and inverts an output signal of the first inverter INV1 to output the inverted signal to the storage node SN. The first and second inverters INV1 and INV2 are composed of high-voltage transistors. The second inverter INV2 is enabled and disabled in response to a third control signal CONT3 and an inverted third control signal /CONT3, and latches the signal at the storage node SN when enabled. The first inverter INV1 buffers the signal at the storage node SN to thereby output the buffered signal to outside.

In FIG. 4, a first high-voltage transistor HVT1, a decoding unit 320, and a second high-voltage transistor HVT2 which are identical with the constituent elements shown in FIG. 3 are assigned the same reference numerals, and repeated explanations thereof will be omitted or simplified.

As described above, the improved IC chip shown in FIG. 4 has not only a level-shifting function and a decoding/pre-decoding function but also a latching function which operates at a predetermined time in response to a control signal. That is, the improved IC chip can be compact designed by incorporating the latching function, the level-shifting function, and the decoding function.

Figure 5:
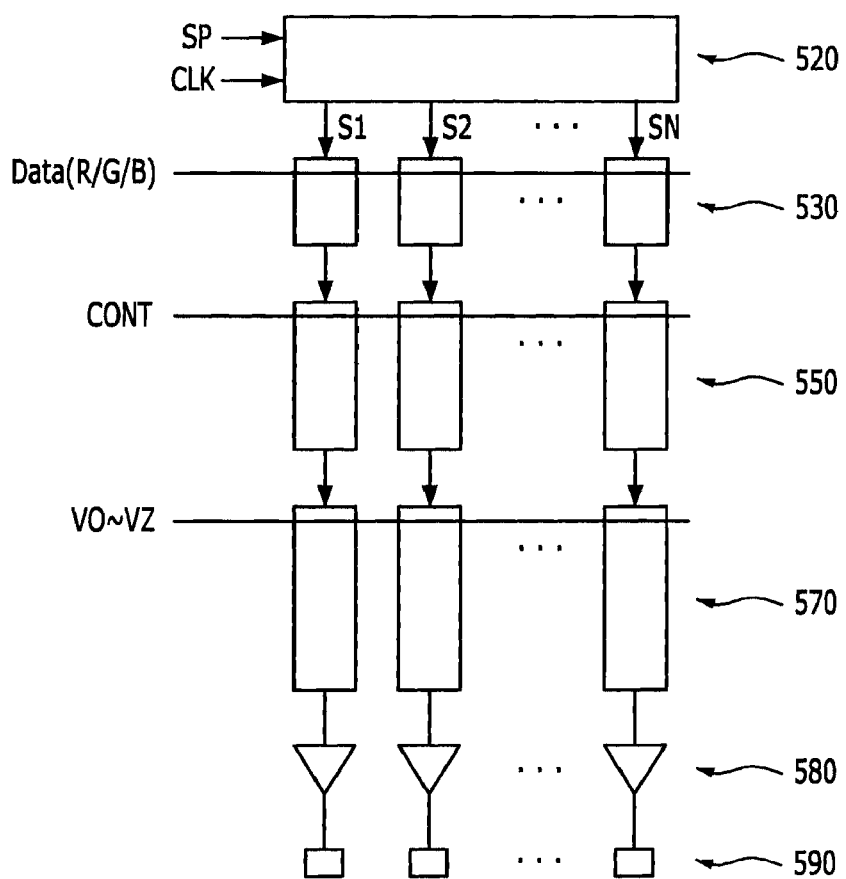
FIG. 5 is a circuit diagram of a source driving device incorporating the IC chip shown in FIGS. 3 and 4 in accordance with an embodiment of the present invention.

FIG. 5 is a circuit diagram of a source driving device incorporating the IC chip shown in FIGS. 3 and 4 in accordance with an embodiment of the present invention.

Referring to FIG. 5, the source driving device in accordance with the embodiment of the present invention includes a shift register 520, a sampling latch 530, an improved circuit block 550, a decoder 570, and an output buffer 580.

The shift register 520 shifts a start pulse SP input from outside, e.g., a controller, in response to a clock signal CLK. The sampling latch 530 samples digital image data R/G/B input from the controller in response to a plurality of shift signals S1 to SN output from the shift register 520. The improved circuit block 550 pre-decodes data output from the sampling latch 530 and shifts and converts a voltage level of the pre-decoded data in response to a control signal CONT.

The decoder 570 decodes the pre-decoded digital image data to transfer corresponding one of a plurality of gradation voltages V0 to VZ generated from a gradation voltage generator (not shown) to the output buffer 580. Herein, the decoder 570 performs a function of a digital to analog converter (DAC). The output buffer 580 buffers the gradation voltages V0 to VZ to output them to an output pad 590. The gradation voltages V0 to VZ output from the output pad 590 are provided to a pixel array of a display panel As compared with the conventional source driving device shown in FIG. 1, the source driving device in accordance with the embodiment of the present invention includes the improved circuit block 550 which incorporates functions of the hold latch 40, the level shifter 50 and the pre-decoder 60 shown in FIG. 1. Since the improved circuit block 550 has substantially the same structure as that of the IC chip shown in FIGS. 3 and 4, the detailed explanations thereof will be omitted or simplified.

A decoding unit (the decoding unit 320 shown in FIGS. 3 and 4) of the improved circuit block 550 performs a function of the pre-decoder, and the input signals IN1 to IN4 are data transferred from the sampling latch 530. The second control signal CONT2 input to the second high-voltage transistor HVT2 includes a horizontal sync signal HSYNC.

In the source driving device of the present invention, the improved circuit block 550 incorporates the plural functions, and thus has fewer transistors in compared with the conventional source driving device shown in FIG. 1. For example, the pre-decoder of the conventional source driving device is implemented with the NAND gates while that of the present invention is only implemented with the NMOS transistors. Accordingly, the number of transistors used in the present invention is significantly decreased.

Figure 6:
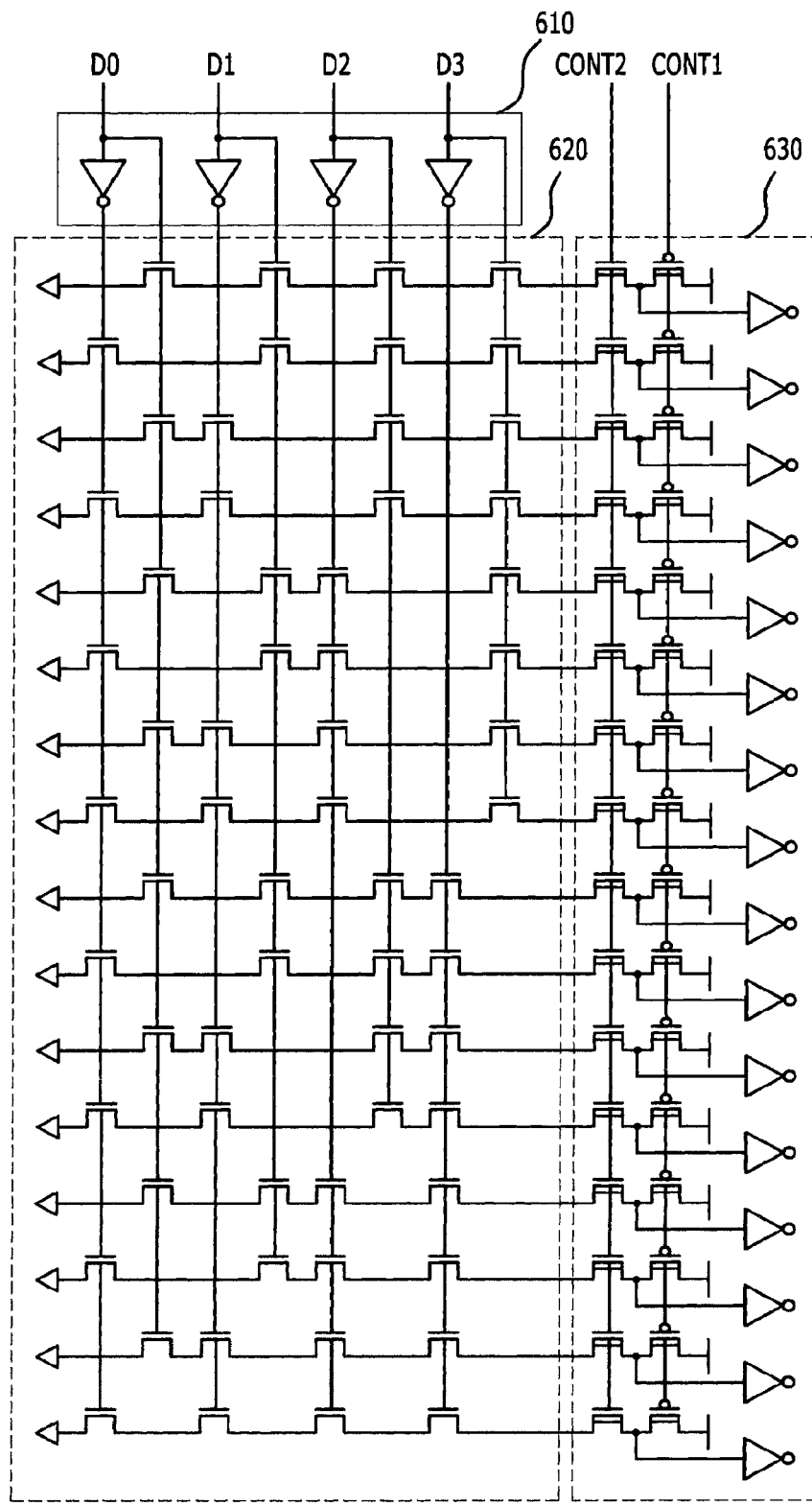
FIG. 6 is a circuit diagram of a circuit block array with respect to a channel.
Figure 7A:
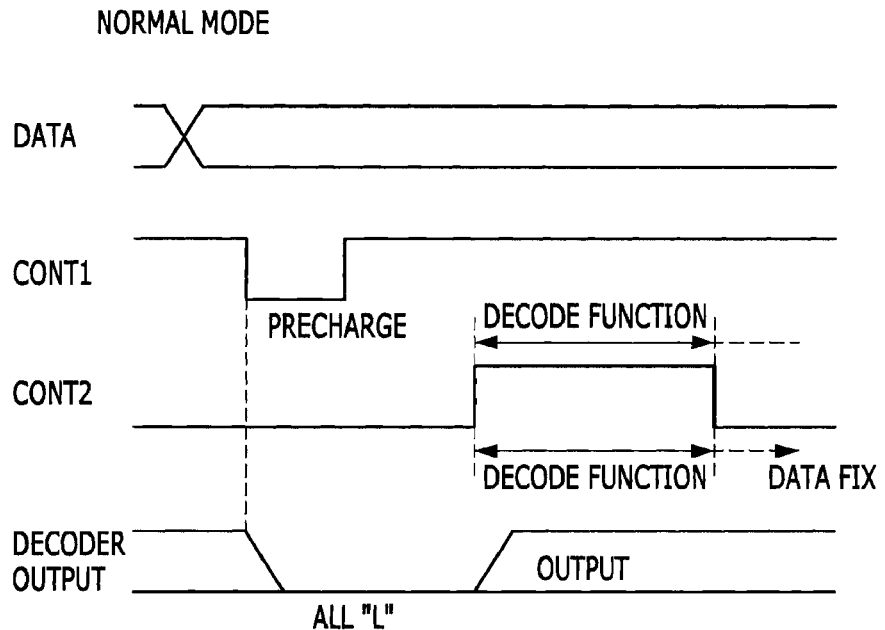
FIGS. 7A and 7B show timing diagrams of data and commands input to the circuit block array in FIG. 6, during a normal mode and a test mode, respectively.
Figure 7B:
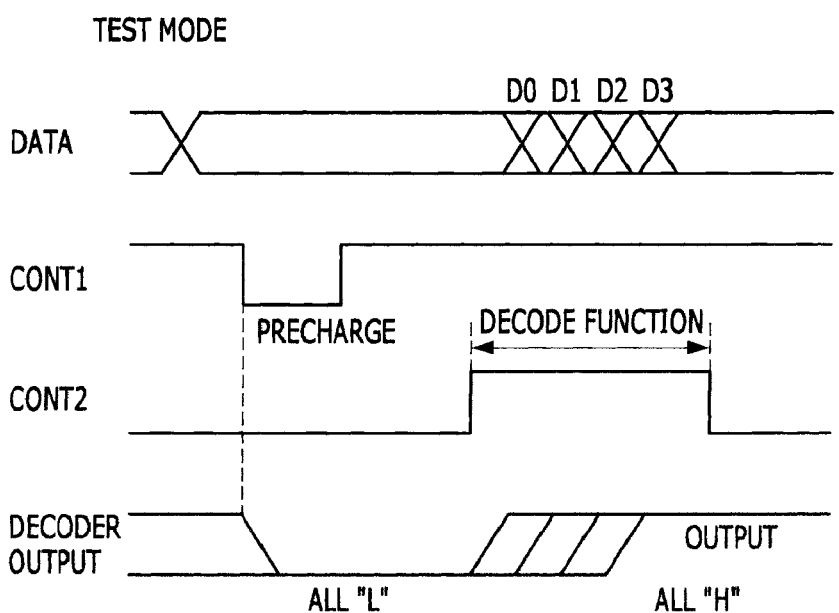

FIG. 6 is a circuit diagram of a circuit block array with respect to a channel. FIGS. 7A and 7B show timing diagrams of data and commands input to the circuit block array in FIG. 6, during a normal mode and a test mode, respectively.

Referring to FIG. 6, the circuit block array includes an input unit 610, a pre-decoding unit 620, and a functional block 630. The function block 630 is composed of high-voltage transistors but the pre-decoding unit 620 is composed of low-voltage transistors. Accordingly, the input unit 610 is also composed of low-voltage transistors.

In the constitution in FIG. 6, when a voltage stress for a reliability test is applied, output signals of plural circuits in the pre-decoding unit 620 corresponding to plural circuits of the functional block 630 may be output as the same logic value. As described above, since some of the circuit block array is implemented with low-voltage transistors, a circuit configuration for a reliability test can be simplified. As a result, it is possible to reduce the chip size and the test time thereof in comparison with the prior art.

The voltage stress may be applied through additional test circuits. Here, transistors constituting the additional test circuits include low-voltage transistors. Is possible to test the pre-decoder by replacing the high voltage stress with data applied to the pre-decoder of the source driving device without additional test circuits.

For reference, FIG. 7A shows that data and control signals CONT1 and CONT2 are input to the input unit 610 and the functional block 630, respectively, during the normal mode. Thus, a precharge function and a decoding function are performed in response to the input data and control signals CONT1 and CONT2. FIG. 7B shows that the data and the control signals CONT1 and CONT2 are input to the input unit 610 and the functional block 630, respectively, during the test mode. Thus, a precharge function and a decoding function are performed in response to the input data and control signals CONT1 and CONT2.

In particular, during the test mode in FIG. 7B, in response to the control signal CONT2, high-voltage NMOS transistors in the functional block 630 are turned on, and thus, output results of the pre-decoding unit 620 are output based on the data D0 to D3 input to the input unit 610.

Figure 8A:
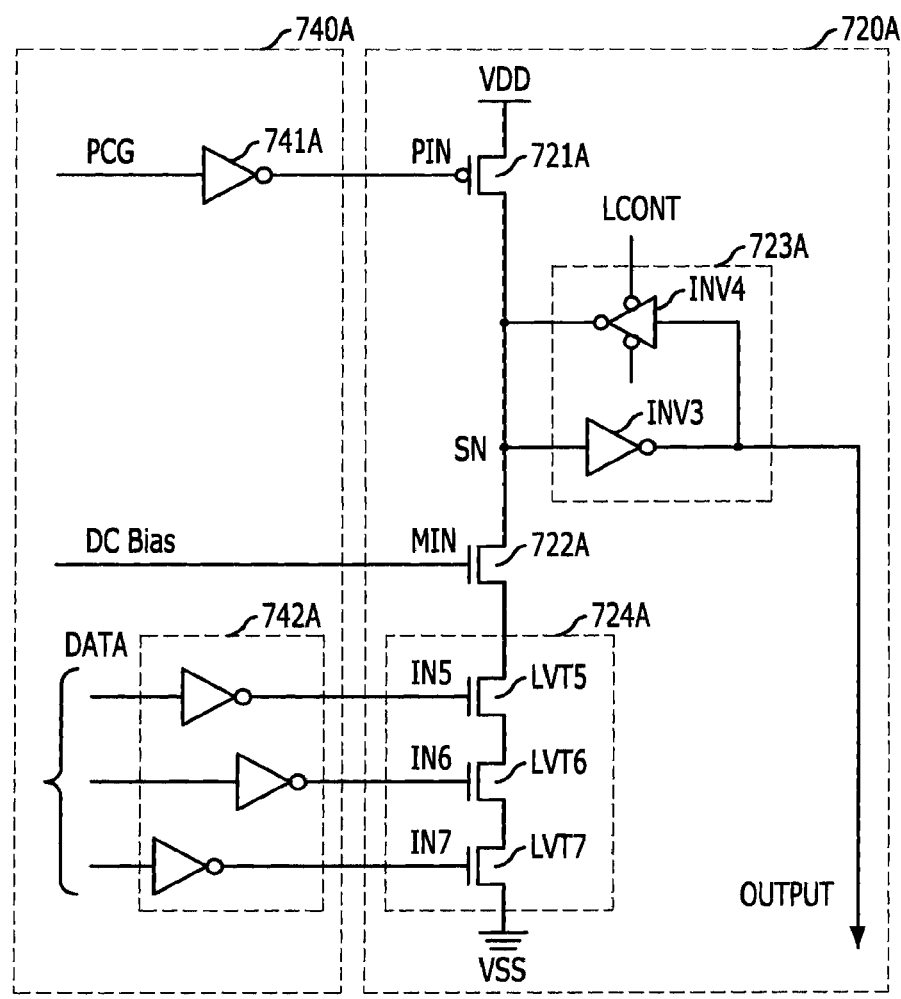
FIGS. 8A to 8C are circuit diagrams of an IC chip in accordance with other embodiments of the present invention.
Figure 8B:
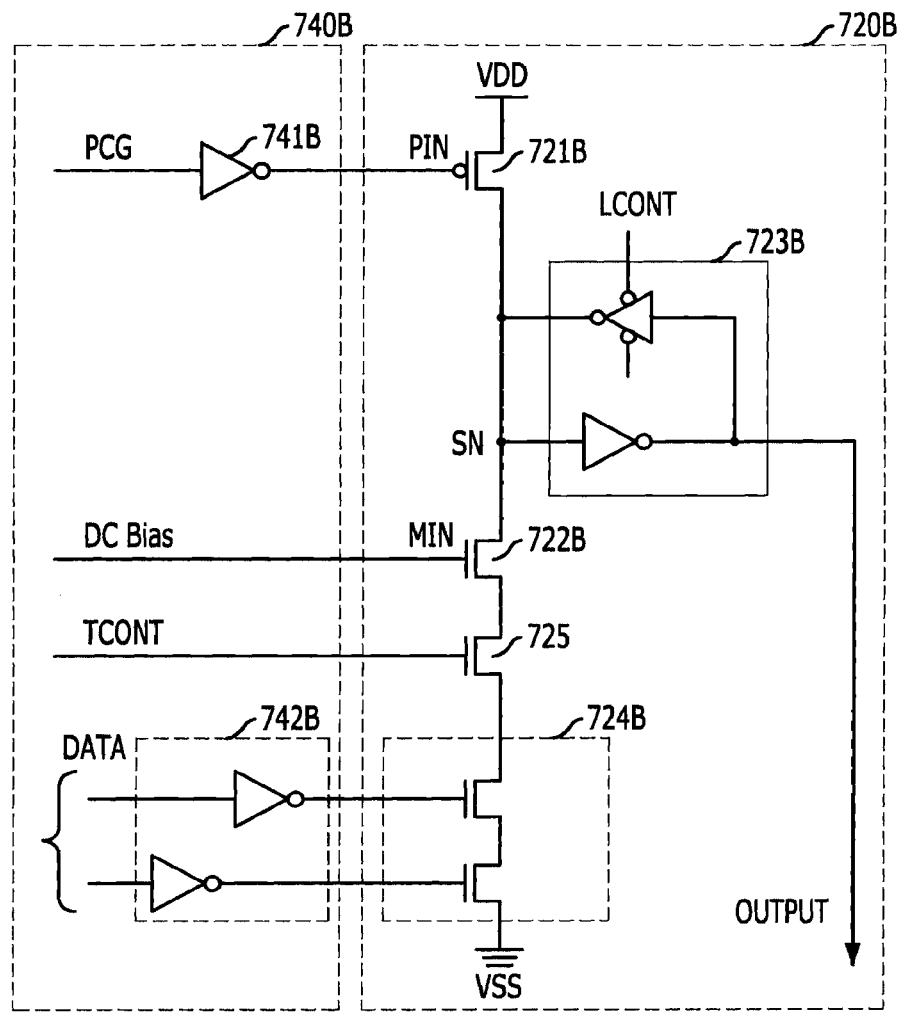
Figure 8C:
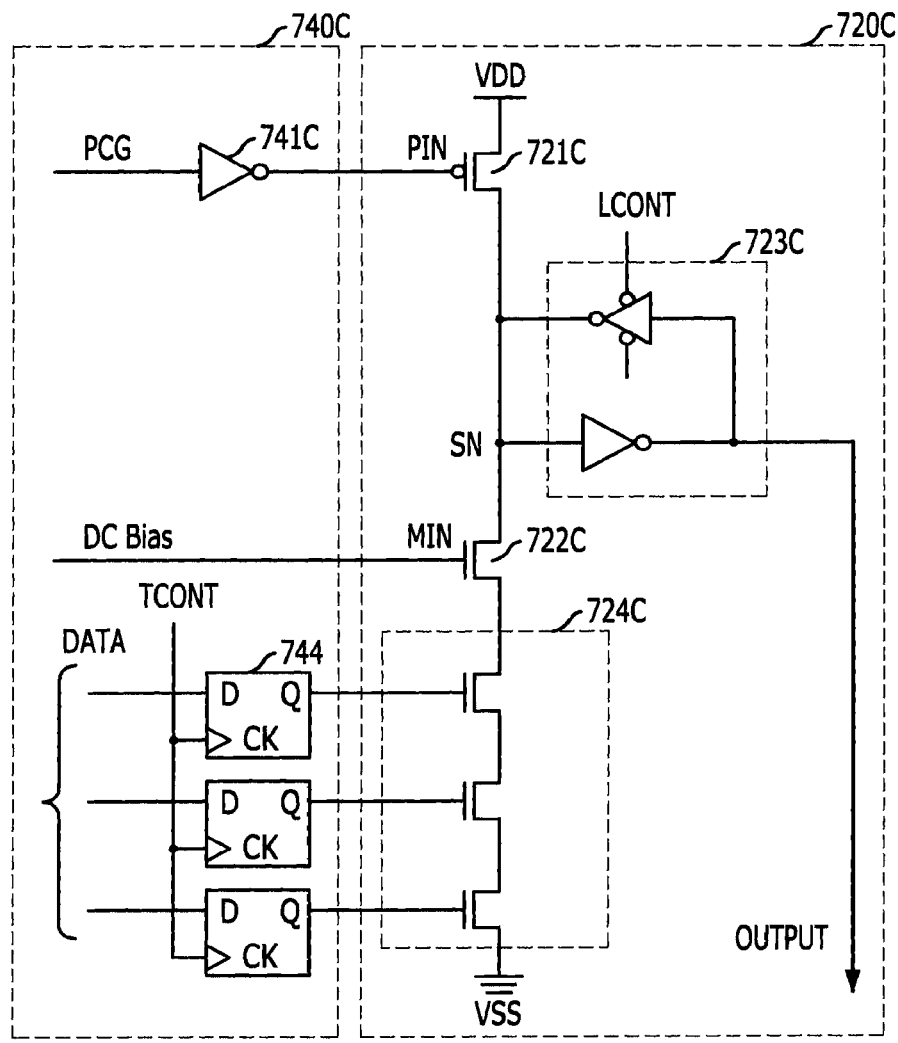

FIGS. 8A to 8C are circuit diagrams of an IC chip in accordance with other embodiments of the present invention.

Referring to FIG. 8A, the IC chip includes a unit circuit block 720A and a control unit 740A. The IC chip may have plural unit circuit blocks 720A which are controlled by one control unit 740A.

The unit circuit block 720A includes a first high-voltage transistor 721A, a second high-voltage transistor 722A, a latch unit 723A, and a decoding unit 724A.

The first high-voltage transistor 721A includes a high-voltage PMOS transistor which has a source-drain path between a first source supply terminal VDD and a storage node SN, and a gate receiving a first gate signal PIN to thereby precharge the storage node SN in response to the first gate signal PIN.

The second high-voltage transistor 722A includes a high-voltage NMOS transistor having a source-drain path between an output terminal of the decoding unit 724A and the storage node SN, and a gate receiving a second gate signal MIN being biased with a DC voltage. A signal having a low voltage level may be used as the second gate signal MIN to thereby protect low-voltage transistors LVT5 to LVT7 in the decoding unit 724A. Here, the second high-voltage transistor 722A operates as a voltage limiter.

The decoding unit 724A includes the low-voltage transistors LVT5 to LVT7 coupled between the second high-voltage transistor 722A and a second source supply terminal ground voltage VSS in series, and decodes a plurality of input signals IN5 to IN7 to provide the decoded signal to the storage node SN. The low-voltage transistors LVT5 to LVT7 are implemented with a plurality of low-voltage NMOS transistors whose gate receives a corresponding one of the input signals IN5 to IN7.

The latch unit 723A includes first and second inverters INV3 and INV4. The first inverter INV3 receives and inverts a signal at the storage node SN to output the inverted signal to outside. The second inverter INV4 receives and inverts an output signal of the first inverter INV3 to output the inverted signal to the storage node SN. The first and second inverters INV3 and INV4 are implemented with a high-voltage transistor. The second inverter INV4 is enabled and disabled in response to a loop control signal LCONT, and latches the signal at the storage node SN when enabled. The first inverter INV3 buffers the signal at the storage node SN to thereby output the buffered signal to outside.

The control unit 740A includes a first buffer 741A for buffering a precharge signal PCG to output the first gate signal PIN to the gate of the first high-voltage transistor 721A. The first buffer 741A includes a high-voltage element. The control unit 740A further includes a second buffer 742A for buffering input data to output the input signals IN5 to IN7 to the decoding unit 724A. The second buffer 742A includes a low-voltage element.

Referring to FIG. 8B, the IC chip includes a unit circuit block 720B and a control unit 740B. The IC chip may have plural unit circuit blocks 720B which are controlled by one control unit 740B.

The unit circuit block 720B includes a first high-voltage transistor 721B, a second high-voltage transistor 722B, a latch unit 723B, a decoding unit 724B, and a switching transistor 725.

Since the first high-voltage transistor 721B, the second high-voltage transistor 722B and the latch unit 723B have substantially the same structures as those of the IC chip shown in FIG. 8A, the detailed explanations thereof will be omitted. The decoding unit 724B also has substantially the same structure as that of the decoding unit 724A shown in FIG. 8A except for decoding two inputs.

The switching transistor 725 includes a low-voltage NMOS transistor having a source-drain path between the second high-voltage transistor 722B and an output node of the decoding unit 724B, and a gate receiving a timing control signal TCONT.

Since the control unit 740B has substantially the same structure as that of the control unit 740A shown in FIG. 8A, the detailed explanations thereof will be omitted or simplified.

In the IC chip shown in FIG. 8B, the second high-voltage transistor 722B operates as only a voltage limiter. In addition, by the switching transistor 725 operating in response to timing control signal TCONT, it is possible to control timing when an output signal of the decoding unit 724B is transferred to the second high-voltage transistor 722B.

Referring to FIG. 8C, the IC chip includes a unit circuit block 720C and a control unit 740C. The IC chip may have plural unit circuit blocks 720C which are controlled by one control unit 740C.

The unit circuit block 720C includes a first high-voltage transistor 721C, a second high-voltage transistor 722C, a latch unit 723C, and a decoding unit 724C.

The first high-voltage transistor 721C, the second high-voltage transistor 722C and the latch unit 723C have substantially the same structures as those of the IC chip shown in FIG. 8A except that a plurality of input decoding signals input to each gate of low-voltage transistors in the decoding unit 724C is not a simple buffered signal but includes a timing component.

That is, the control unit 740C includes a plurality of D flip-flops 744 for transferring input data to each gate of the low-voltage transistors in the decoding unit 724C in response to a timing control signal TCONT. The number of the D flip-flops 744 corresponds to that of the input data.

In the IC chip shown in FIG. 8C, the second high-voltage transistor 722C operates as only a voltage limiter. Further, because the input decoding signals has the timing component, it is possible to control timing when an output signal of the decoding unit 724C is transferred to the second high-voltage transistor 722C.

The buffer 741C has substantially the same structure as that of the first buffer 741A shown in FIG. 8A.

The IC chips shown in FIGS. 8A to 8C can be compact designed by incorporating a data storing function, a level-shifting function, a decoding function and a voltage limiting function. Furthermore, the improved IC chip can operate under low power condition because the improved IC chip has only a charge/discharge voltage without a punch-through voltage. In addition, the decoding units 724A, 724B and 724C are implemented with low-voltage NMOS transistors instead of NAND gates, thereby reducing a chip size and a test time for a reliability test.

The IC chips shown in FIGS. 8A to 8C can be applied to a driving unit of a display device. That is, the IC chips shown in FIGS. 8A to 8C can be applied to the improved circuit block 550 of the source driving device shown in FIG. 5

As described above, an improved IC chip in accordance with the present invention has compact designed by incorporating a data storing/latching function, a level-shifting function, and a decoding/pre-decoding function. Thus, it is possible to reduce a chip size of a source driving device by implementing the source driving device using the improved IC chip.

Furthermore, when a voltage stress for a reliability test is applied, a time for the reliability test can be reduced in comparison with the conventional source driving device. In the conventional source driving device, a level shifter has a punch-through current flowing thereon during operating. However, in the present invention, the improved IC chip only has a charge/discharge current so that the improved IC chip can operate under low power condition.

As described above, the technical idea of the present invention has been specifically described with respect to the preferred embodiments, but it should be noted that the foregoing embodiments are provided only for illustration while not limiting the present invention. In particular, it can be understood by a person with ordinary skill in the art that various changes and modifications may be made without departing from the spirit and scope of the invention as defined in the following claims.

What is claimed is:

1. An integrated circuit (IC) chip, comprising:
a first high-voltage transistor configured to pre-charge a predetermined node, in response to a first control signal;
a decoding unit configured to decode input signals, and to output a decoded signal to the node;
a second high-voltage transistor configured to transfer an output of the decoding unit to the node, in response to a second control signal; and
a latch unit configured to latch a signal at the node,
wherein the decoding unit includes low-voltage transistors, coupled in series between a first supply voltage terminal and the second high-voltage transistor.

2. The IC chip of claim 1, wherein the latch unit includes:
a first inverter configured to receive and invert the signal at the node, to output the inverted signal to outside; and
a second inverter configured to receive and invert an output signal of the first inverter, and to output the inverted signal to the node,
wherein the first and second inverters include high-voltage transistors.

3. The IC chip of claim 2, wherein the second inverter is enabled and disabled in response to a third control signal.

4. The IC chip of claim 1, wherein the low-voltage transistors include NMOS transistors whose gates receive the input signals.

5. The IC chip of claim 1, wherein the first high-voltage transistor includes a high-voltage PMOS transistor having a source-drain path connected between a second supply voltage terminal and the node, and a gate configured to receive the first control signal.

6. The IC chip of claim 1, wherein the second high-voltage transistor includes a high-voltage NMOS transistor having a source-drain path connected between the node and an output node of the decoding unit, and a gate configured to receive the second control signal.

7. A source driving device, comprising:
a sampling latch configured to sample and latch image data input from outside;
a circuit block configured to pre-decode data output from the sampling latch, and shift and latch a voltage level of the pre-decoded data in response to a control signal; and
a decoder configured to decode the pre-decoded image data, and to transfer one of a plurality of gradation voltages,
wherein the circuit block includes:
a first high-voltage transistor configured to pre-charge a predetermined node, in response to a first control signal;
a pre-decoding unit configured to decode input signals, and to output a decoded signal to the node;
a second high-voltage transistor configured to transfer an output of the decoding unit to the node, in response to a second control signal; and
a latch unit configured to latch a signal at the node,
wherein the pre-decoding unit includes low-voltage transistors, coupled in series between a first supply voltage terminal and the second high-voltage transistor.

8. The source driving device of claim 7, wherein the latch unit includes:
a first inverter configured to receive and invert the signal at the node, to output the inverted signal to outside; and
a second inverter configured to receive and invert an output signal of the first inverter, and to output the inverted signal to the node,
wherein the first and second inverters include high-voltage transistors.

9. The source driving device of claim 8, wherein the second inverter is enabled and disabled in response to a third control signal.

10. The source driving device of claim 7, wherein the low-voltage transistors include NMOS transistors whose gates receive the input signals.

11. The source driving device of claim 7, further comprising:
a test unit configured to make some output signals of plural circuits in the pre-decoding unit corresponding to the circuit block to have the same logic value for a reliability test of the pre-decoding unit.

12. The source driving device of claim 11, wherein the test unit includes a plurality of low-voltage transistors.

13. The source driving device of claim 7, wherein the first high-voltage transistor includes a high-voltage PMOS transistor having a source-drain path connected between a second supply voltage terminal and the node, and a gate configured to receive the first control signal.

14. The source driving device of claim 7, wherein the second high-voltage transistor includes a high-voltage NMOS transistor having a source-drain path connected between the node and an output node of the decoding unit, and a gate configured to receive the second control signal.

15. An integrated circuit (IC) chip, comprising:
a first high-voltage transistor configured to pre-charge a predetermined node;
a latch unit configured to latch a signal at the node;
a decoding unit configured to decode input signals, and to output a decoded signal to the node; and
a second high-voltage transistor coupled between the node and an output node of the decoding unit, and configured to operate as a voltage limiter,
wherein the decoding unit includes low-voltage transistors, coupled in series between a first supply voltage terminal and the second high-voltage transistor.

16. The IC chip of claim 15, wherein the second high-voltage transistor includes a high-voltage NMOS transistor having a gate configured to receive a signal being biased with a DC voltage.

17. The IC chip of claim 15, further comprising:
a switching transistor configured to transfer an output signal of the decoding unit to the second high-voltage transistor in response to a timing control signal.

18. The IC chip of claim 17, wherein the switching transistor includes a low-voltage NMOS transistor having a gate configured to receive the timing control signal.

19. The IC chip of claim 15, wherein the input signals input to the decoding unit include timing components, to control timing when an output signal of the decoding unit is transferred to the second high-voltage transistor.

20. The IC chip of claim 19, further comprising:
a D flip-flop configured to provide input data to the decoding unit, in response to a timing control signal.

21. The IC chip of claim 15, wherein the latch unit includes a high-voltage transistor.

\* \* \* \* \*